United States Patent
El-Essawy et al.

(10) Patent No.: US 8,742,748 B2
(45) Date of Patent: *Jun. 3, 2014

(54) CALIBRATION OF NON-CONTACT CURRENT SENSORS

(71) Applicant: International Business Machines Corporation, Armonk, NY (US)

(72) Inventors: Wael El-Essawy, Austin, TX (US); Alexandre Peixoto Ferreira, Austin, TX (US); Thomas Walter Keller, Austin, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 18 days.

This patent is subject to a terminal disclaimer.

(21) Appl. No.: 13/890,838

(22) Filed: May 9, 2013

(65) Prior Publication Data

US 2013/0241529 A1  Sep. 19, 2013

Related U.S. Application Data

(63) Continuation of application No. 13/159,536, filed on Jun. 14, 2011, now Pat. No. 8,508,212.

(51) Int. Cl.
*G01R 11/32* (2006.01)

(52) U.S. Cl.
USPC .......................................................... 324/74

(58) Field of Classification Search
None
See application file for complete search history.

(56) References Cited

U.S. PATENT DOCUMENTS

| | | |
|---|---|---|
| 4,005,380 A | 1/1977 | Heilmann et al. |
| 4,378,525 A | 3/1983 | Burdick |
| 4,558,276 A | 12/1985 | Comeau et al. |
| 5,473,244 A | 12/1995 | Libove et al. |
| 5,867,020 A | 2/1999 | Moore et al. |
| 6,008,634 A | 12/1999 | Murofushi et al. |
| 6,522,509 B1 | 2/2003 | Engel et al. |
| 6,654,219 B1 | 11/2003 | Romano et al. |
| 6,661,239 B1 | 12/2003 | Ozick |

(Continued)

FOREIGN PATENT DOCUMENTS

| | | |
|---|---|---|
| CN | 201654106 U | 11/2010 |
| WO | WO2009042414 A2 | 4/2009 |

OTHER PUBLICATIONS

U.S. Appl. No. 13/682,112, filed Nov. 20, 2012, Carpenter, et al.

(Continued)

*Primary Examiner* — Melissa Koval
*Assistant Examiner* — Trung Nguyen
(74) *Attorney, Agent, or Firm* — Mitch Harris, Atty at Law, LLC; Andrew M. Harris; John D. Flynn

(57) ABSTRACT

Calibration of a non-contact current sensor provides improved accuracy for measuring current conducted through a conductor such as an AC branch circuit wire. In a calibration mode, a predetermined DC current is injected through a conductor integrated in the non-contact current sensor. The magnitude of the magnetic field is measured using a sensing element of the non-contact current sensor. Then, when operating in measurement mode, a current conducted in a wire passing through the non-contact current sensor is determined by correcting the output of the non-contact current sensor using the result of the measurement made in the calibration mode.

20 Claims, 4 Drawing Sheets

(56) References Cited

U.S. PATENT DOCUMENTS

| | | |
|---|---|---|
| 6,703,842 B2 | 3/2004 | Itimura et al. |
| 6,708,126 B2 | 3/2004 | Culler et al. |
| 6,825,649 B2 | 11/2004 | Nakano |
| 6,940,291 B1 | 9/2005 | Ozick |
| 7,068,045 B2 | 6/2006 | Zuercher et al. |
| 7,098,644 B1 | 8/2006 | Denison |
| 7,148,675 B2 | 12/2006 | Itoh |
| 7,227,348 B2 | 6/2007 | Sorenson |
| 7,230,413 B2 | 6/2007 | Zhang et al. |
| 7,265,533 B2 | 9/2007 | Lightbody et al. |
| 7,315,161 B2 | 1/2008 | Zribi et al. |
| 7,330,022 B2 | 2/2008 | Bowman et al. |
| 7,474,088 B2 | 1/2009 | Bowman et al. |
| 7,493,222 B2 | 2/2009 | Bruno |
| 7,546,214 B2 | 6/2009 | Rivers, Jr. et al. |
| 7,622,912 B1 | 11/2009 | Adams et al. |
| 7,714,594 B2 | 5/2010 | Ibuki et al. |
| 7,719,257 B2 | 5/2010 | Robarge et al. |
| 7,719,258 B2 | 5/2010 | Chen et al. |
| 7,847,543 B2 | 12/2010 | Grno |
| 7,990,133 B2 | 8/2011 | Dockweiler |
| 2004/0227503 A1 | 11/2004 | Bowman |
| 2005/0156587 A1 | 7/2005 | Yakymyshyn et al. |
| 2006/0087777 A1 | 4/2006 | Bruno |
| 2007/0058304 A1 | 3/2007 | Parker et al. |
| 2008/0077336 A1 | 3/2008 | Fernandes |
| 2008/0079437 A1 | 4/2008 | Robarge et al. |
| 2009/0105973 A1 | 4/2009 | Choi et al. |
| 2010/0001715 A1 | 1/2010 | Doogue et al. |
| 2010/0264944 A1 | 10/2010 | Rupert |
| 2010/0271037 A1 | 10/2010 | Blakely |
| 2012/0200285 A1 | 8/2012 | Carpenter et al. |
| 2012/0200293 A1 | 8/2012 | Carpenter et al. |
| 2012/0319674 A1* | 12/2012 | El-Essawy et al. ............ 324/74 |
| 2012/0319676 A1 | 12/2012 | El-Essawy et al. |

OTHER PUBLICATIONS

U.S. Appl. No. 13/596,658, filed Aug. 28, 2012, El-Essawy, et al.
U.S. Appl. No. 13/024,199, filed Feb. 9, 2011, Carpenter, et al.
U.S. Appl. No. 13/024,181, filed Feb. 9, 2011, Carpenter, et al.
"AC Current sensor with Interface" downloaded from: http://www.electronicspoint.com/ac-current-sensor-interface-t221239.html on Jun. 10, 2011.
"Smart Current Signature Sensor" downloaded from http://technology.ksc.nasa.gov/successes/SS-Smart-Current-Signal-Snsr.htm on Jun. 10, 2011.
Dwyer, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 24, 2011.
Valuetesters.com on-line catalog: "non-contact voltage probes", downloaded from http://valuetesters.com/Voltage-Probe-Non-contact.php on May 24, 2011.
McKenzie, et al. "Non-contact Voltage Measurement using Electronically Varying Capacitance", Electronics Letters, Feb. 4, 2010, vol. 46, No. 3, UK.
Silicon Chip, "Current Clamp Meter Adapter for DMMs", issue 180, published Sep. 12, 2003.
Silicon Chip, "Compact 0-80A Automotive Ammeter", issue 165, pp. 1-12, downloaded from www.siliconchip.com.au/cms/A 03551/article.html Nov. 4, 2010, published Jun. 30, 2002.
Ziegler, et al., "Current Sensing Techniques: A Review", IEEE Sensors Journal, Apr. 2009, pp. 354-376 vol. 9, No. 4. Piscataway, NJ.
Notice of Allowance in U.S. Appl. No. 13/159,536 mailed on Apr. 8, 2013.

* cited by examiner

CALIBRATION OF NON-CONTACT CURRENT SENSORS

This U.S. patent application is a Continuation of U.S. patent application Ser. No. 13/159,536, filed on Jun. 14, 2012, and claims priority thereto under 35 U.S.C.§120.

BACKGROUND OF THE INVENTION

1. Field of the Invention

The present invention is related to power measurement systems, and more specifically to calibration of a non-contact sensor that includes a magnetic field sensor for detecting the current in a wire of a power distribution system.

2. Description of Related Art

A need to measure power consumption in AC line powered systems is increasing due to a focus on energy efficiency for both commercial and residential locations. In order to provide accurate measurements, the characteristics of the load must be taken into account along with the current drawn by the load.

In order to determine current delivered to loads in an AC power distribution system, and in particular in installations already in place, current sensors are needed that provide for easy coupling to the high voltage wiring used to supply the loads, and proper isolation is needed between the power distribution circuits/loads and the measurement circuitry.

Non-contact current sensors provide for easy installation, circuit isolation and other advantages in power measurement systems. However, such sensors may vary in fabrication, installation and application and the relationship between the measured current and the output of the sensor may not be well established.

Therefore, it would be desirable to provide techniques for calibrating non-contact current sensors and systems including such calibration.

BRIEF SUMMARY OF THE INVENTION

The invention is embodied in a calibration method and sensors and systems including calibration circuits and other calibration features that implement the techniques of the present invention.

The method and system select between a calibration mode and a measurement mode in a circuit connected to a non-contact current sensor. In the calibration mode, the system conducts a predetermined DC current in a conductor included in the current sensor and measures the magnitude of a magnetic field generated by the predetermined current using the output of a sensing element within the current sensor. In the measurement mode, the system measures a magnitude of the magnetic field generated by current conducted in a wire passing through the non-contact current sensor using an output of the sensing element and corrects the result in conformity with a result of the measurement made in the calibration mode.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses current sensing systems and methods, as well as sensor devices that perform or are adapted for, calibration of a non-contact current sensor by using a voltage sensing conductor to inject a predetermined current in a calibration mode and using the current sensor to obtain a current sensor calibration value. The current may be an AC current or a DC current. In measurement mode, the voltage sensing conductor is used to measure the magnitude and/or the phase of the voltage on a wire inserted in the non-contact current sensor by measuring the electrostatic field generated by the wire. During subsequent measurements of current through a wire inserted in the non-contact current sensor, the output of the current sensor is corrected using the current sensor calibration value. Further, failure to detect an output from the current sensor at a threshold level in response to injection the predetermined current can be used as a sensor failure indication. In other operating modes, an adjustable current can be injected using the voltage sensing conductor and the linearity (current step to sensor output voltage/current step) determined or mapped for the sensor, and also a saturation current level can be determined as a current level at which the output of the current sensor starts to lose linear relationship with the injected current.

Figure 1A:
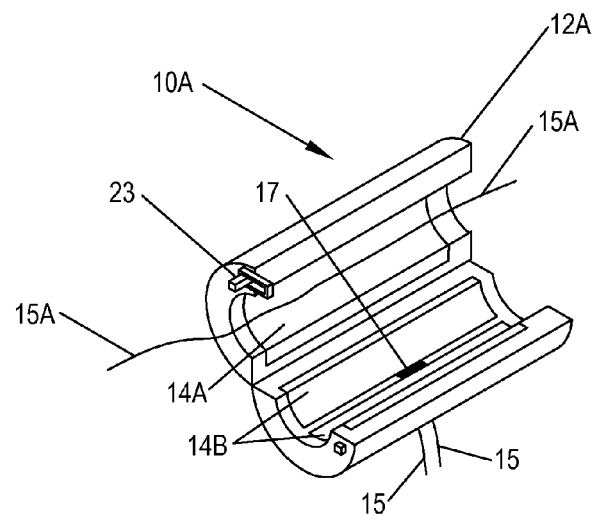
FIG. 1A and FIG. 1B are isometric views and FIG. 1C is a cross-section view of a sensor according to an embodiment of the present invention.
Figure 1B:
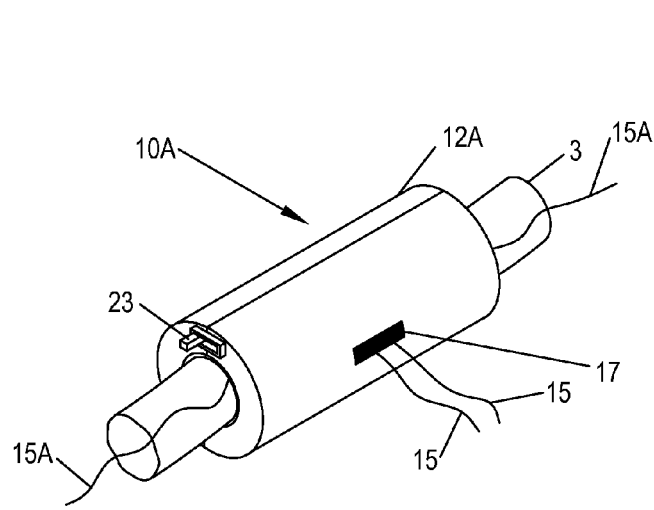
Figure 1C:
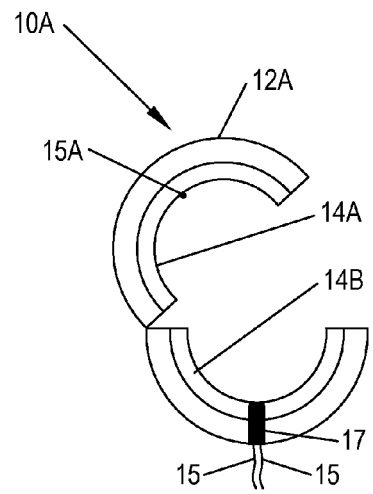

Referring now to FIGS. 1A-1C, a sensor 10A that may be used in a system in accordance with an embodiment of the present invention is shown. A plastic sensor body 12A encloses a current sensor that provides information about a magnitude and phase of a current passing through a wire 3 around which sensor body is detachably secured as shown in FIG. 1B. A latch 23 secures a top portion and a bottom portion of sensor body 12A together, along with a hinge formed on sensor body 12A at an opposite side from latch 23. A current sensing portion of sensor 10A is formed by three ferrite pieces 14A, 14B that form a ferrite cylinder around wire 3, when sensor body 12A is closed. Top ferrite piece 14A forms a half-cylinder, while ferrite pieces 14B define a gap between ferrite pieces 14B and in the circumference of the ferrite cylinder, in which current sensing element 17, which is generally a semiconductor magnetic field sensor, such as a Hall effect sensor, is disposed. Current sensing element 17 is shown as having interface wires 15 extending from its body, but other types of terminals may be used as an alternative manner of providing connections to current sensing element 17. An aperture is formed through sensor body 12A to receive current sensing element 17. A voltage sensor is formed by a wire 15A that extends through sensor body 12A and continues outside of sensor body for connection to external processing circuits. However wire 15A may alternatively terminate on a terminal or other suitable electrical connector disposed on sensor body 12A. The voltage sensor provides an AC waveform that is at least indicative of the phase of the voltage on wire 3 and may be calibrated to provide an indication of the magnitude of the voltage if needed. FIG. 1C illustrates a cross section of sensor 10A showing details of the relationship between current sensing element 17, ferrite pieces 14A and 14B, and voltage sensing conductor wire 15A within sensor body 12A. In the present invention voltage sensing conductor wire 15A is used to provide calibration of current sensor 10A as will be described in further detail below.

Figure 2:
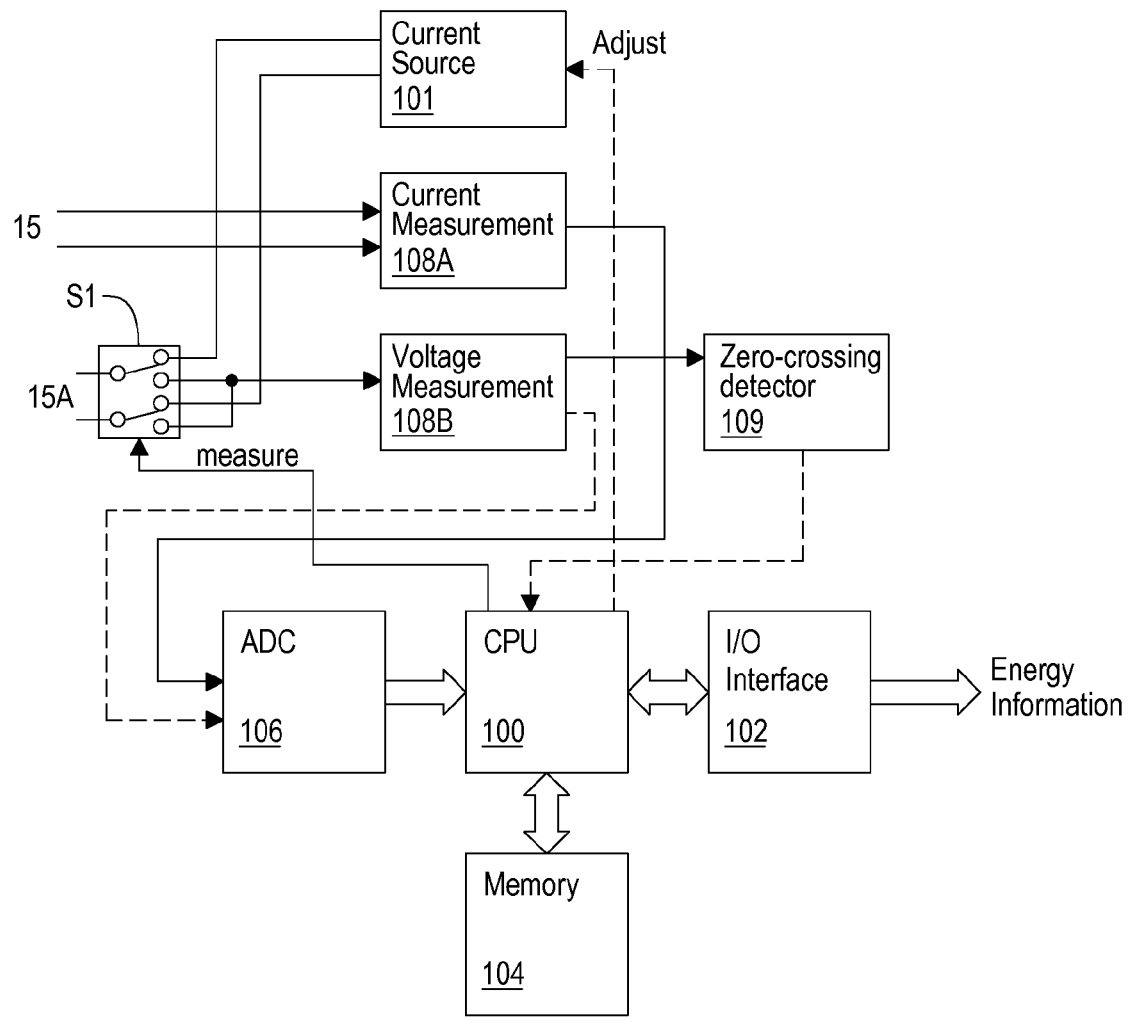
FIG. 2 is an electrical block diagram illustrating circuits for receiving inputs from sensors according to embodiments of the present invention.

Referring now to FIG. 2, a circuit in accordance with an embodiment of the invention is shown in a block diagram. The circuit of FIG. 2 implements a system for measuring current that receives input from the current/voltage sensors of FIGS. 1A-1C or other current sensors including current sensors 3A-3B and 4A-4B as described below. Interface wires 15 from current sensing element 17 provide input to a current measurement circuit 108A, which is an analog circuit that appropriately scales and filters the current channel output of the sensor. The output of current measurement circuit 108A is provided as an input to an analog-to-digital converter (ADC) 106, which converts the current output waveform generated by current measurement circuit 108A to sampled values provided to a central processing unit (CPU) 100 that performs power calculations in accordance with program instruction stored in a memory 104 coupled to CPU 104. Alternatively, current measurement circuit 108A may be omitted and current sensing element 17 may be connected directly to ADC 106. The power usage by the circuit associated with a particular current sensor can be determined by assuming that the circuit voltage is constant (e.g., 115V rms for electrical branch circuits in the U.S.) and that the phase relationship between the voltage and current is aligned (i.e., in-phase). However, while the assumption of constant voltage is generally sufficient, as properly designed properly distribution systems do not let the line voltage sag more than a small amount, e.g., <3%, the phase relationship between voltage and current is dependent on the power factor of the load, and can vary widely and dynamically by load and over time. Therefore, it is generally desirable to at least know the phase relationship between the branch circuit voltage and current in order to accurately determine power usage by the branch circuit. An input/output (I/O) interface 102 provides either a wireless or wired connection to a local or external monitoring system.

The voltage sensor wires 15A from each end of sensor 10A are provided to a selector S1 that is controlled by a control signal measure provided from CPU 100. When control signal measure is asserted, the circuit is in measurement mode, and the voltage sensor wires 15A from each end of sensor 10A are coupled together and provided to an input of voltage measurement circuit 108B, which is an analog circuit that appropriately scales and filters the voltage channel output of the sensor. A zero-crossing detector 109 may be used to provide phase-only information to a central processing unit 100 that performs power calculations, alternatively or in combination with providing an output of voltage measurement circuit to an input of ADC 106. Alternatively, voltage measurement circuit 108B may be omitted and the corresponding output of selector S1 connected directly to ADC 106. When control signal measure is de-asserted, the circuit is in calibration mode, and voltage sensor wires 15A from each end of sensor 10A are coupled to a current source 101 that generates a predetermined calibration current through voltage sensor wire 15A. Also in calibration mode, a current measurement is made to determine an indication of the magnetic field generated by the current passing through voltage sensor wire 15A as indicated by the output of current measurement circuit 108A, which receives the output of the current sensor. Since the predetermined current level generated by current source 101 is known, the output of current measurement circuit 108A provides a scale factor that can be used to correct subsequent measurements of current by current sensor 10A, e.g., the current passing through wire 3. Current source 101 may be a DC current source, so that CPU 100 can use a low-pass filter or integrator algorithm to remove AC noise from the calibration measurement, or alternatively, current source 101 may be an AC current source and a bandpass filter or algorithm can be used to remove other noise and offset from the measurement. The DC calibration measurement may be performed while the current is being passed through wire 3.

An exemplary set of measurements provide illustration of a calibration technique in accordance with the above-described embodiment of the invention. In calibration mode, if the predetermined current level generated by current source 101 is given by $I_{CAL}$ and the output voltage of voltage measurement circuit 108B is given by $V_{CAL}$, then, as long as sensor 10A is linear and all of the circuits in FIG. 2 remain linear, the output of voltage measurement circuit 108B for an unknown current level $I_{UNK}$ is given by:

$$V_{MEAS} = I_{UNK}(V_{CAL}/I_{CAL})$$

Therefore, unknown current level $I_{UNK}$ can be determined from:

$$I_{UNK} = K \cdot V_{MEAS},$$

where calibration value $K = I_{CAL}/V_{CAL}$. Further, if in calibration mode $V_{CAL}$ does not exceed a predetermined threshold, the system can indicate a sensor failure, which may be a connection failure in one of wires 15 or voltage sensing conductor 15A, or may be a failure of sensor 17 or the measurement circuit. Further, while the above equations assume linear behavior, current source 101 may be an adjustable current source that in a linearity measuring mode is adjusted according to a control value Adjust, which controls the magnitude of the current injected in voltage sensing conductor 15A when control signal measure is de-asserted. A table of calibration values may be stored and/or coefficients may be determined to form a piecewise linear or other approximation that permits non-linear computation of $I_{UNK}$ from $V_{MEAS}$. A saturation level may be detected for sensor 10A when increases in the adjustable current level commanded by control value Adjust no longer lead to expected increases in measured voltage level $V_{MEAS}$. For example, operation of the sensing system may be restricted to current levels that have less than a predetermined error due to non-linearity in the sensor, or the measurement range may extend to levels at which correction has high error due to the measured voltage level $V_{MEAS}$ changing by small fractions of the value expected if sensor 10A were linear.

Once the system is calibrated, when power factor is not taken into account, the instantaneous power used by each branch circuit in a power distribution can be computed as:

$$P_{BRANCH} = V_{rms} * I_{meas}$$

where $V_{rms}$ is a constant value, e.g. 115V, and $I_{meas}$ is a measured rms current value, such as an rms current value computed by the circuit of FIG. 2 from the calibrated current measurements described above. Power value $P_{BRANCH}$ may be integrated over time to yield the energy use. When the phase of the voltage is known, then the power may be computed more accurately as:

$$P_{BRANCH} = V_{rms} * I_{meas} * \cos(\Phi)$$

where Φ is a difference in phase angle between the voltage and current waveforms. The output of zero-crossing detector 109 may be compared with the position of the zero crossings in the current waveform generated by current measurement circuit 108A and the time ΔT between the zero crossings in the current and voltage used to generate phase difference Φ from the line frequency (assuming the line frequency is 60 Hz):

$$\Phi = 2\Pi * 60 * \Delta T$$

In general, the current waveform is not truly sinusoidal and the above approximation may not yield sufficiently accurate results. A more accurate method is to multiply current and voltage samples measured at a sampling rate much higher than the line frequency. The sampled values thus approximate instantaneous values of the current and voltage waveforms and the energy may be computed as:

$$\Sigma(V_n * I_n)$$

A variety of arithmetic methods may be used to determine power, energy and phase relationships from the sampled current and voltage measurements.

Figure 3A:
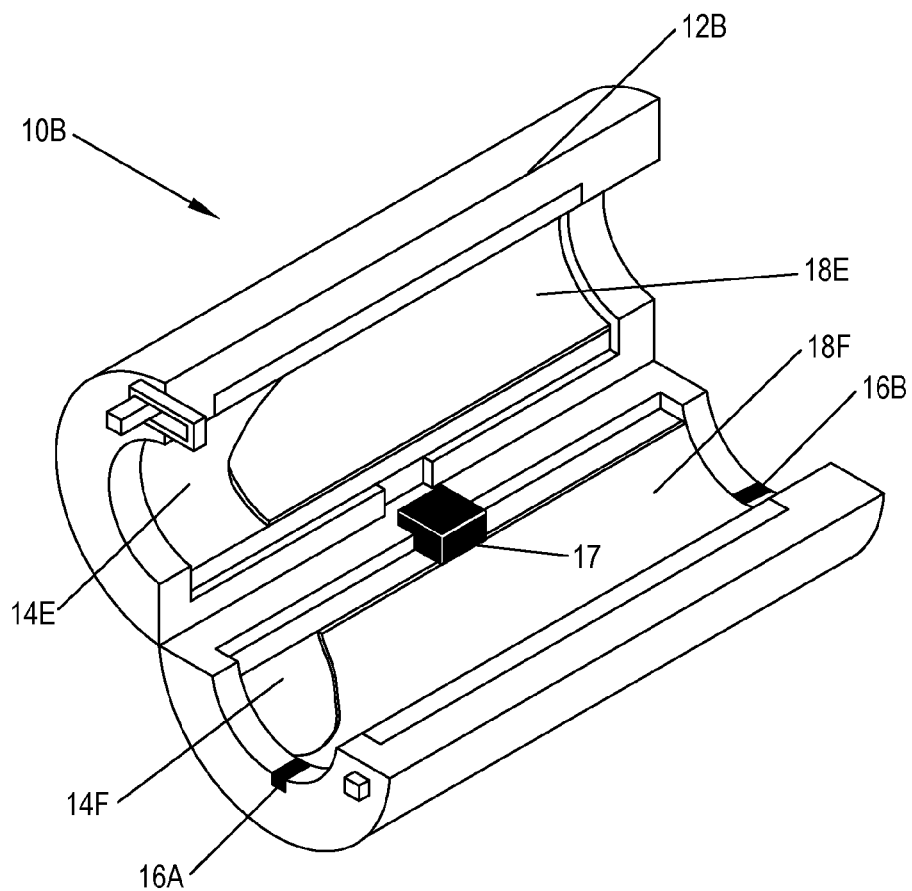
FIG. 3A is an isometric view and FIG. 3B is a cross-section view of a sensor according to another embodiment of the present invention.
Figure 3B:
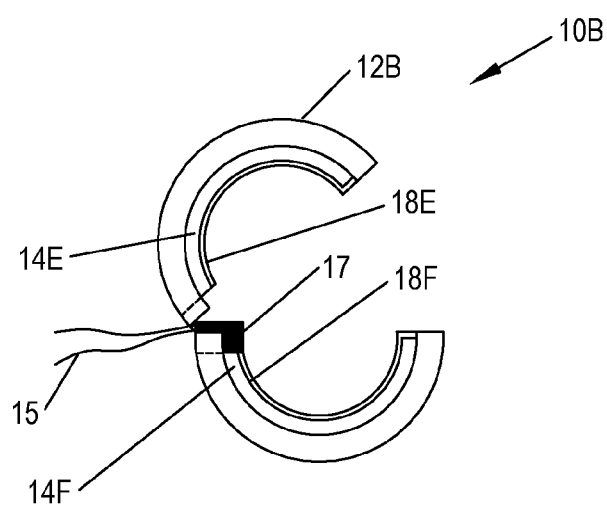

Referring now to FIGS. 3A and 3B, a sensor 10B in accordance with another embodiment of the invention is shown. Sensor 10B is similar to sensor 10A of FIGS. 1A-1C, so only differences between them will be described below. In sensor 10B, a voltage sensor is included. Metal plates 18E and 18F are disposed within ferrite current sensor portions 14E and 14F and provide capacitive coupling to a wire disposed within current sensor 10B, when sensor body 12B is closed. Metal plates 18E and 18F may be inserts mechanically secured by sensor shell 12B, or metal films bonded to or deposited on the interior surfaces of ferrite pieces 14E-14F. A pair of terminals 16A and 16B provide solderable connections at the ends of sensor body 12B so that wires may be attached to connect to metal plate 18F. In the illustrated example, metal plates 18E and 18F include jogs at their ends in order to provide electrical contact between them and ferrite pieces 14E-14F do not make contact as in sensor 10A of FIGS. 1A-1C. Therefore, the total circumferential gap in the ferrite cylinder is increased slightly. However, in alternative embodiments, the jogs may be omitted from metal plates 18E and 18F and alternative electrical connection techniques may be employed, such as including additional terminals. In calibration mode, metal plates 18E and 18F conduct the predetermined calibration current in combination.

Figure 4A:
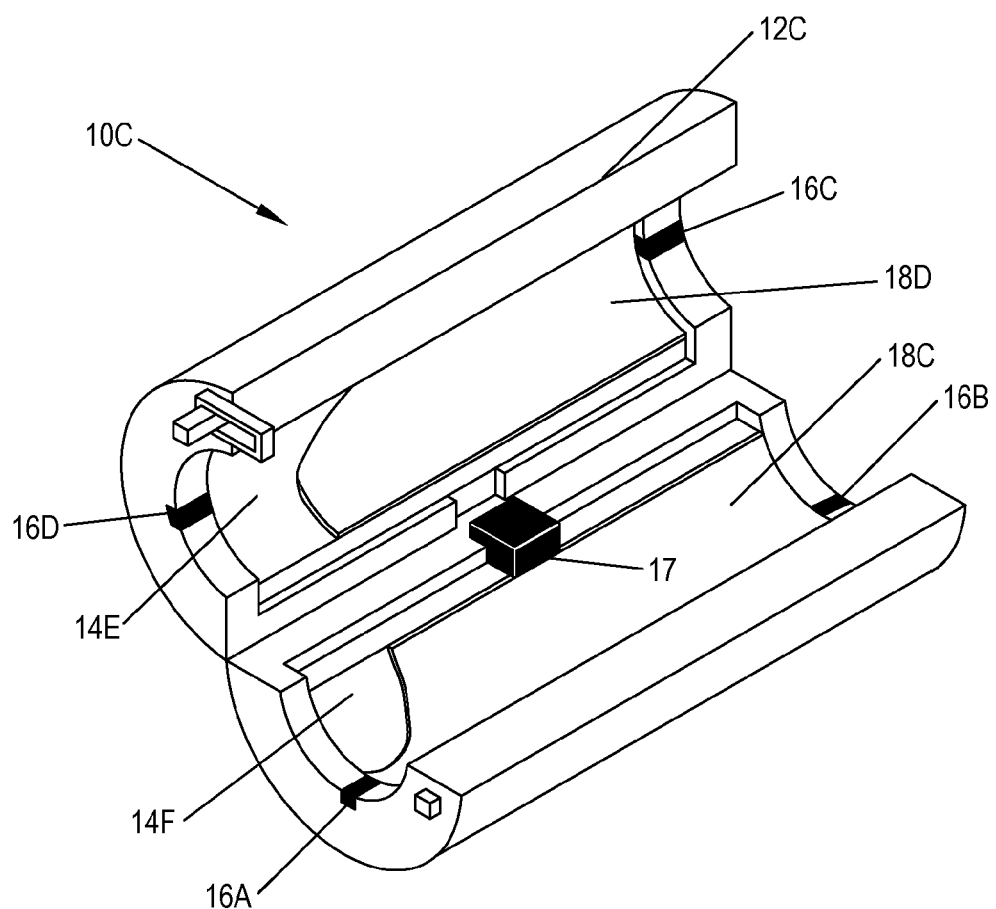
FIG. 4A is an isometric view and FIG. 4B is a cross-section view of a sensor according to yet another embodiment of the present invention.
Figure 4B:
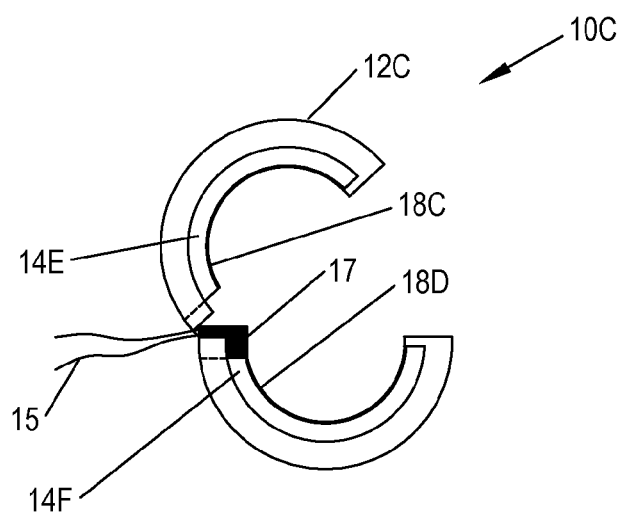

Referring now to FIGS. 4A and 4B, a sensor 10C in accordance with yet another embodiment of the invention is shown. Sensor 10C is similar to sensor 10B of FIGS. 3A-3B, so only differences between them will be described below. Each of metal plates 18C and 18D include a separate set of terminals 16A,16B and 16C,16D, which can be connected in parallel pairs, or independently selected for injecting the predetermined calibration current during calibration mode.

While the invention has been particularly shown and described with reference to the preferred embodiments thereof, it will be understood by those skilled in the art that the foregoing and other changes in form, and details may be made therein without departing from the spirit and scope of the invention.

What is Claimed is:

1. A circuit, comprising:
    a current sensor having a housing for detachably coupling the sensor to a wire;
    a current sensing device integrated in the housing for providing a current sensor output indicative of an AC current conducted through the wire;
    a calibration conductor that does not make electrical contact with the wire and extends through the housing;
    a DC current source coupled to the calibration conductor for providing a DC current through the calibration conductor; and
    a current measuring circuit that measures the current sensor output of the current sensing device to obtain a current calibration value by filtering and measuring a DC component of the current sensor output, wherein the current measuring circuit further measures an AC component of the current sensor output to obtain an AC current measurement value and adjusts a value of the AC current measurement value in conformity with the current calibration value.

2. The circuit of Claim 1, wherein the current measuring circuit measures the DC component of the current sensor output to obtain the current calibration value while the wire conducts an AC current.

3. The circuit of Claim 1, wherein the calibration conductor is a voltage sensing conductor used to measure an electric potential on the wire when the circuit is in a measurement mode, and wherein the circuit further comprises a selector circuit coupled to the voltage sensing conductor for selecting between the measurement mode and a calibration mode, wherein in the calibration mode, the selector circuit couples terminals of the voltage sensing conductor to the DC current source, and wherein in the measurement mode, the selector circuit couples a terminal of the voltage sensing conductor to a voltage measurement circuit for measuring the electric potential on the wire.

4. The circuit of Claim 1, wherein the current measuring circuit comprises:
    an analog to digital converter having an input for receiving the current sensor output from the current sensing device; and
    a processing circuit for executing program instructions that adjust the value of the current sensor output in conformity with a stored value of the current calibration value.

5. The circuit of Claim 1, wherein the current sensing device is a semiconductor magnetic field sensor.

6. The circuit of Claim 1, wherein the current sensor comprises:
    at least two ferrite cylinder portions disposed within the housing, wherein when the housing is coupled to the wire, the wire passes through a central void defined by the ferrite cylinder portions extending through a central axis thereof, and wherein a gap is defined along a circumference of a cylinder formed by the ferrite cylinder portions; and
    a semiconductor magnetic field sensor disposed within the gap, wherein the current sensor output is a voltage output of the semiconductor magnetic field sensor.

7. The circuit of Claim 6, wherein the calibration conductor is a voltage sensing conductor used to measure an electric potential on the wire when the circuit is in a measurement mode, and wherein the circuit further comprises a selector circuit coupled to the voltage sensing conductor for selecting between the measurement mode and a calibration mode, wherein in the calibration mode, the selector circuit couples terminals of the voltage sensing conductor to the DC current source, and wherein in the measurement mode, the selector circuit couples a terminal of the voltage sensing conductor to a voltage measurement circuit for measuring the electric potential on the wire.

8. The circuit of Claim 7, wherein the voltage sensing conductor is a conductive metal cylinder having a radius smaller than and disposed within the ferrite cylinder portions, wherein the first terminal and the second terminal of the voltage sensing conductors are located at opposing ends of the conductive metal cylinder.

9. The circuit of Claim 8, wherein the conductive metal cylinder is a metal layer deposited or affixed to at least one of the ferrite cylinder portions.

10. The circuit of Claim 1, wherein the DC current source is a variable current source that causes an adjustable current to be conducted through the calibration conductor, and wherein the current measuring circuit measures the current sensor output of the current sensing device and detects when the first output of the current sensing device is not increasing proportionate to increases in the adjustable current, whereby the current measuring circuit determines a saturation current level of the current sensor.

11. The circuit of Claim 1, wherein the DC current source is a variable current source that causes an adjustable current to be conducted through the calibration conductor, and wherein the current measuring circuit measures the current sensor output of the current sensing device and compares increases in the current sensor output of the current sensing device to increases in the adjustable current, whereby the current measuring circuit determines an indication of the linearity of the of the current sensor.

12. The circuit of Claim 1, wherein in the calibration mode, the current measuring circuit generates an indication that the current sensing device has failed if an expected level of the current sensing output of the current sensing device is not obtained in response to the DC current.

13. A method for calibrating a non-contact current sensor, comprising:
   detachably coupling the non-contact sensor to a wire;
   first measuring a first magnitude of a first AC magnetic field generated by an AC current conducted in the wire using an output of a sensing element within the non-contact current sensor;
   conducting a DC calibration current of predetermined magnitude through a calibration conductor passing through the non-contact current sensor;
   second measuring and filtering a second magnitude of a second DC magnetic field generated by the predetermined current in the calibration conductor using the output of the sensing element to obtain a current measurement calibration value; and
   correcting a result of the first measuring in conformity with the current measurement calibration value.

14. The method of Claim 13, wherein the first measuring is performed while the AC current is conducted in the wire.

15. The method of Claim 13, further comprising:
   selecting between a calibration mode and a measurement mode in a circuit connected to the non-contact current sensor;
   responsive to selecting the measurement mode, performing the first measuring and the correcting; and
   responsive to selecting the calibration mode, performing the conducting and the second measuring.

16. The method of Claim 14, further comprising detachably securing a housing of the non-contact current sensor around the wire, wherein the first measuring measures a first indication of the current conducted in the wire by measuring a magnitude of magnetic flux in a ferrite cylinder disposed around the wire and secured within the housing, and wherein the second measuring measures a second indication of the DC current conducted in the calibration conductor by measuring a magnitude of magnetic flux in the ferrite cylinder.

17. The method of Claim 14, further comprising:
   selecting a saturation current measurement mode; and
   responsive to selecting the saturation current measurement mode, providing an adjustable current level through the calibration conductor;
   fourth measuring the output of the current sensing element; and
   detecting when a result of the fourth measuring is not increasing proportionate to increases in the adjustable current to determine a saturation current level of the non-contact current sensor.

18. The method of Claim 14, further comprising:
   selecting a linearity measurement mode;
   responsive to selecting the linearity measurement mode, providing an adjustable current level through the calibration conductor;
   fourth measuring the output of the current sensing element; and
   comparing increases in the output of the current sensing device to increases in the adjustable current to determine an indication of the linearity of the of the non-contact current sensor.

19. The method of Claim 14, further comprising responsive to selecting the calibration mode, generating an indication that the non-contact current sensor has failed if an expected level of the output of the current sensing element is not obtained in response to the calibration current.

20. A non-contact current sensor, comprising:
   a housing for detachably coupling the sensor to a wire;
   a current sensing device comprising at least two ferrite cylinder portions disposed within the housing, wherein when the housing is coupled to the wire, the wire passes through a central void defined by the ferrite cylinder portions extending through a central axis thereof, and wherein a gap is defined along a circumference of a cylinder formed by the ferrite cylinder portions integrated in the housing;
   a semiconductor magnetic field sensor disposed within the gap;
   a calibration conductor that does not make electrical contact with the wire and extends through the housing;
   a DC current source coupled to the calibration conductor for providing a DC current through the calibration conductor; and
   a current measuring circuit that measures a current sensor output of the semiconductor magnetic field sensor to obtain a current calibration value by filtering and measuring a DC component of the current sensor output while the wire conducts an AC current, wherein the current measuring circuit further measures an AC component of the current sensor output to obtain an AC current measurement value and adjusts a value of the AC current measurement value in conformity with the current calibration value.

* * * * *